(12) United States Patent
Covaro et al.

(10) Patent No.: US 8,890,663 B2
(45) Date of Patent: *Nov. 18, 2014

(54) TRANSMISSION OF POWER AND DATA AT MULTIPLE POWER LEVELS

(71) Applicant: Redwood Systems, Inc., Fremont, CA (US)

(72) Inventors: Mark Covaro, Sonoma, CA (US); Dave Leonard, Danville, CA (US)

(73) Assignee: Redwood Systems, Inc., Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/859,992

(22) Filed: Apr. 10, 2013

(65) Prior Publication Data

US 2013/0229268 A1 Sep. 5, 2013

Related U.S. Application Data

(63) Continuation of application No. 12/389,868, filed on Feb. 20, 2009, now Pat. No. 8,427,300.

(51) Int. Cl.
G08C 19/16 (2006.01)
H03K 7/08 (2006.01)

(52) U.S. Cl.
CPC . *G08C 19/16* (2013.01); *H03K 7/08* (2013.01)
USPC .................. 340/12.16; 340/12.35; 340/12.32; 340/12.37; 340/506; 340/538

(58) Field of Classification Search
None
See application file for complete search history.

(56) References Cited

U.S. PATENT DOCUMENTS

| | | | |
|---|---|---|---|
| 3,660,738 A | 5/1972 | Anderson et al. |
| 4,578,533 A | 3/1986 | Pierce |
| 4,725,762 A | 2/1988 | Jagschitz |
| 4,737,787 A | 4/1988 | Ito et al. |
| 4,740,952 A | 4/1988 | Vernieres et al. |
| 4,949,359 A | 8/1990 | Voillat |
| 5,293,628 A | 3/1994 | Langan et al. |

(Continued)

FOREIGN PATENT DOCUMENTS

| | | |
|---|---|---|
| EP | 1 087 506 A2 | 3/2001 |
| JP | 60-140950 | 7/1985 |
| WO | WO 99/67880 | 12/1999 |

OTHER PUBLICATIONS

IRPLLED1 350mA to 1.5A High Voltage LED Driver using IRS2540, Source—www.irf.com, downloaded Feb. 17, 2009, pp. 1-29.

(Continued)

*Primary Examiner* — Daryl Pope
(74) *Attorney, Agent, or Firm* — Myers Bigel Sibley & Sajovec, P.A.

(57) ABSTRACT

In one embodiment, an apparatus includes a circuit coupled to a line, where the circuit may power a device, and where the power is transmitted to the device over the line as a pulse-width modulated signal. The circuit may set a duty cycle of the pulse-width modulated signal in order to transmit a determined power level to the device. The apparatus may vary a frequency of the pulse-width modulated signal to transmit data to the device while the duty cycle of the pulse-width modulated signal is fixed in order to continue to transmit the determined power level to the device. A variation in the frequency of the pulse-width modulated signal may be detectable by the device and represents at least a portion of the data.

13 Claims, 8 Drawing Sheets

(56) References Cited

U.S. PATENT DOCUMENTS

| | | | |
|---|---|---|---|
| 5,396,555 A | 3/1995 | Shibata et al. |
| 5,473,635 A | 12/1995 | Chevroulet |
| 5,627,833 A | 5/1997 | Bliven |
| 5,668,446 A | 9/1997 | Baker |
| 5,684,826 A | 11/1997 | Ratner |
| 5,793,754 A | 8/1998 | Houldsworth et al. |
| 5,798,913 A | 8/1998 | Tiesinga et al. |
| 5,903,607 A | 5/1999 | Tailliet |
| 5,905,406 A | 5/1999 | Sugden et al. |
| 6,097,761 A | 8/2000 | Bühring et al. |
| 6,111,918 A | 8/2000 | Gotaas |
| 6,144,292 A | 11/2000 | Brown |
| 6,229,432 B1 | 5/2001 | Fridley et al. |
| 6,295,356 B1 | 9/2001 | De Nicolo |
| 6,348,780 B1 | 2/2002 | Grant |
| 6,496,104 B2 | 12/2002 | Kline |
| 6,535,983 B1 | 3/2003 | McCormack et al. |
| 6,549,120 B1 | 4/2003 | De Buda |
| 6,654,409 B1 | 11/2003 | Scott et al. |
| 6,674,270 B2 | 1/2004 | Sakamoto |
| 6,772,011 B2 | 8/2004 | Dolgin |
| 6,812,584 B2 | 11/2004 | Renner |
| 6,853,173 B2 | 2/2005 | Caine et al. |
| 6,870,282 B1 | 3/2005 | Bischoff et al. |
| 6,980,122 B2 | 12/2005 | Novikov |
| 7,005,969 B2 | 2/2006 | Fisher et al. |
| 7,012,505 B1 | 3/2006 | Arden |
| 7,042,351 B2 | 5/2006 | Kline |
| 7,102,490 B2 | 9/2006 | Flen et al. |
| 7,113,547 B2 | 9/2006 | Inoue et al. |
| 7,126,463 B2 | 10/2006 | Bauerle et al. |
| 7,205,749 B2 | 4/2007 | Hagen et al. |
| 7,279,855 B2 | 10/2007 | Tahara et al. |
| 7,327,222 B2 | 2/2008 | Peltonen |
| 7,369,629 B2 | 5/2008 | Umewaka |
| 7,420,142 B2 | 9/2008 | Barrena et al. |
| 7,583,734 B2 | 9/2009 | Nakashima et al. |
| 8,058,750 B2 | 11/2011 | Covaro et al. |
| 8,207,635 B2 | 6/2012 | Covaro et al. |
| 8,248,230 B2 | 8/2012 | Covaro et al. |
| 2003/0043038 A1 | 3/2003 | Izadinia et al. |
| 2003/0090244 A1 | 5/2003 | Shenai et al. |
| 2003/0189495 A1 | 10/2003 | Pettler et al. |
| 2004/0124338 A1 | 7/2004 | Cloutier et al. |
| 2005/0200317 A1 | 9/2005 | Novikov |
| 2005/0213352 A1 | 9/2005 | Lys |
| 2005/0231133 A1 | 10/2005 | Lys |
| 2006/0038661 A1 | 2/2006 | Reinhold et al. |
| 2006/0049693 A1 | 3/2006 | Abraham et al. |
| 2006/0152171 A1 | 7/2006 | Kinjou |
| 2006/0222089 A1 | 10/2006 | Dicky |
| 2006/0284728 A1 | 12/2006 | Rubinstein et al. |
| 2006/0290210 A1 | 12/2006 | Foard |
| 2007/0014304 A1 | 1/2007 | Wu et al. |
| 2007/0143508 A1 | 6/2007 | Linnman |
| 2007/0188114 A1 | 8/2007 | Lys et al. |
| 2007/0286305 A1 | 12/2007 | Saggini et al. |
| 2008/0012502 A1 | 1/2008 | Lys |
| 2008/0130322 A1 | 6/2008 | Artusi et al. |
| 2008/0147335 A1 | 6/2008 | Adest et al. |
| 2008/0218148 A1 | 9/2008 | Robertson et al. |
| 2008/0224536 A1 | 9/2008 | Yamazaki |
| 2009/0086487 A1 | 4/2009 | Ruud et al. |
| 2009/0236910 A1 | 9/2009 | Yamada et al. |
| 2010/0138363 A1 | 6/2010 | Batterberry et al. |
| 2010/0141153 A1 | 6/2010 | Recker et al. |
| 2010/0253244 A1 | 10/2010 | Snook et al. |
| 2011/0241567 A1 | 10/2011 | Covaro et al. |

OTHER PUBLICATIONS

Pulse-width Modulation, Source—http://en.wikipedia.org/wiki/Pulse_width_modulation, dated Feb. 2009, pp. 1-6.

Duty Cycle, Source—http://en.wikipedia.org/wiki/Duty_cycle, dated Jan. 8, 2009, pp. 1-2.

Stefanutti, W., Mattavelli, P., Saggini, S., Panseri, L., Communication on Power Lines Using Frequency and Duty-Cycle Modulation in Digitally Controlled dc-dc Converters, IEEE, 2006, pp. 2144-2149.

Saggini, S., Stefanutti, W., Mattavelli, P., Garcea, G., Gihoni, M., Power Line Communication in dc-dc Converters Using Switching Frequency Modulation, IEEE, 2006, pp. 1595-1600.

Stephens, W.E., Banwell, T.C., Lalk, G.R., Robe, T.J., Young, K.C., Transmission of STS-3c (155 Mbit/sec) SONET/ATM Signals Over Unshielded and Shielded Twisted Pair Copper Wire, IEEE, 1992, pp. 170-174.

Aghajeri, S., Shafiee, H., Synchronization in OFDM Powerline Communication Systems in Presence of Narrowband Interferences, IEEE, 2003, pp. 359-362.

Santolaria, A., Balcells, J., González, D., Gago, J., Evaluation of Switching Frequency Modulation in EMI Emissions Reduction Applied to Power Converters, IEEE, 2003, 2306-2311.

Schur, Romed, Speidel, Joachim, Angerbauer, Ralf, Reduction of Guard Interval by Impulse Compression for DMT Modulation on Twisted Pair Cables, IEEE, 2000, pp. 1632-1636.

Barton, Melbourne, Honig, Michael L., Optimization of Discrete Multitone to Maintain Spectrum Compatibility with Other Transmission Systems on Twisted Copper Pairs, IEEE, 1995, pp. 1558-1563.

Office Action, dated Apr. 26, 2011, pp. 1-24, U.S. Appl. No. 12/465,800, U.S. Patent and Trademark Office, Virginia.

Bi-Level Lighting Control Credits, dated Jun. 27, 2002, pp. 1-15, Pacific Gas and Electric Company, available at www.energy.ca.gov.

Fluorescent Ballasts—Dimming, downloaded Mar. 9, 2010, p. 1, Koninklijke Philips Lighting Electronics, The Netherlands, available at www.advance.philips.com.

Mark 7® 0-10 Volt, downloaded Mar. 9, 2010, pp. 1-2, Koninklijke Philips Lighting Electronics, The Netherlands, available at www.advance.philips.com.

Quicktronic Powersense® T8 Dimming Universal Voltage, downloaded Mar. 9, 2010, pp. 1-2, Osram Sylvania, available at www.sylvania.com.

Dimming & Dali Ballasts, downloaded Mar. 9, 2010, pp. 1-2, Osram Sylvania, available at www.sylvania.com.

Notice of Allowance, dated Sep. 28, 2011, pp. 1-9, U.S. Appl. No. 12/465,800, U.S. Patent and Trademark Office, Virginia.

Office Action, dated Nov. 7, 2011, pp. 1-14, U.S. Appl. No. 12/536,231, U.S. Patent and Trademark Office, Virginia.

Notice of Allowance, dated Jan. 6, 2012, pp. 1-11, U.S. Appl. No. 12/536,231, U.S. Patent and Trademark Office, Virginia.

Notice of Allowance, dated Jul. 16, 2012, pp. 1-15, U.S. Appl. No. 12/790,038, U.S. Patent and Trademark Office, Virginia.

Office Action, dated Sep. 26, 2012, pp. 1-11, U.S. Appl. No. 13/568,895, U.S. Patent and Trademark Office, Virginia.

Notice of Allowance, dated Dec. 26, 2012, pp. 1-8, U.S. Appl. No. 13/568,895, U.S. Patent and Trademark Office, Virigina.

Office Action, dated Jan. 4, 2013, pp. 1-22, U.S. Appl. No. 12/753,376, U.S. Patent and Trademark Office, Virginia.

X10 (industry standard), www.wikipedia.org, dated Oct. 4, 2007, pp. 1-7.

Linear Regulator, www.wikipedia.org, Feb. 5, 2009, 5 pgs.

TRANSMISSION OF POWER AND DATA AT MULTIPLE POWER LEVELS

This application is a continuation application of, and claims priority under 35 U.S.C. §120 to, U.S. application Ser. No. 12/389,868, "TRANSMISSION OF POWER AND DATA WITH FREQUENCY MODULATION" filed Feb. 20, 2009, the entire contents of which are incorporated by reference.

TECHNICAL FIELD

The present disclosure relates generally to transmission of power and, in particular, to transmission of power and data together.

BACKGROUND

Twisted pair wiring is a form of wiring in which two conductors are wound together for the purposes of canceling out electromagnetic interference (EMI) from external sources and crosstalk between neighboring pairs. The two conductors may represent a line. Twisted pair wiring is the primary wire type for telephone usage.

Ethernet over twisted pair typically includes four or more lines of twisted pair wiring. In some examples, networked devices connected to Ethernet over twisted pair have been configured to receive data over a first one of the lines of twisted pair wiring and to receive power over a second one of the lines of twisted pair wiring.

SUMMARY

Power and data are provided over a same line. The power may be regulated by pulse width modulation. The data may be provided by frequency variation while keeping the average power provided the same. Alternatively or in addition, the data may be provided through alteration of impedance on the line and detection of the alteration of the impedance through variations in an operating frequency of a power converter.

A first apparatus may be provided that includes a circuit coupled to a line, where the circuit is configured to power a device, the power is transmitted over the line as a pulse-width modulated signal. The circuit may also be configured to set a duty cycle of the pulse-width modulated signal in order to transmit a determined power level to the device. The circuit may be further configured to vary a frequency of the pulse-width modulated signal to transmit data to the device while the duty cycle of the pulse-width modulated signal is fixed to continue to transmit the determined power level to the device. A variation in the frequency of the pulse-width modulated signal is detectable by the device and represents at least a portion of the data.

A second apparatus may be provided that includes a circuit coupled to a line, where the circuit is configured to receive power over the line as a pulse-width modulated signal having a determined duty cycle, and the pulse-width modulated signal powers the second apparatus. The circuit may be further configured to detect data in the pulse-width modulated signal, where the pulse-width modulated signal has the determined duty cycle but has a different one of multiple frequencies over time. Each one of the frequencies corresponds to a portion of the data.

A method may be provided to power a device and transmit data to the device in one signal. The device may be powered by transmitting power to the device in a form of a pulse-width modulated signal. A duty cycle of the pulse-width modulated signal may be maintained in order to transmit a determined power level to the device. Data may be transmitted to the device by frequency-shift keying the pulse-width modulated signal while maintaining the duty cycle of the pulse-width modulated signal. The variation in the frequency of the pulse-width modulated signal may be detectable by the device and represents at least a portion of the data.

A system may be provided that includes a load device and a control device, where the control device is electrically coupled to the load device over a line and the control device powers the load device. The load device may be configured to receive power over the line from the control device. The load device may also be configured to add impedance to the line in order to transmit information to the control device. The control device may include a power converter. The control device may, in order to receive the information, detect a change in an operating frequency of the power converter created in response to the impedance added to the line.

Other systems, methods, features, and advantages will be, or will become, apparent to one with skill in the art upon examination of the following figures and detailed description. It is intended that all such additional systems, methods, features, and advantages be included within this description, be within the scope of the invention, and be protected by the following claims. Nothing in this section should be taken as a limitation on those claims.

BRIEF DESCRIPTION OF THE DRAWINGS

The components and the figures are not necessarily to scale, emphasis instead being placed upon illustrating the principles of the invention. Moreover, in the figures, like-referenced numerals designate corresponding parts throughout the different views.

WRITTEN DESCRIPTION

Figure 1:
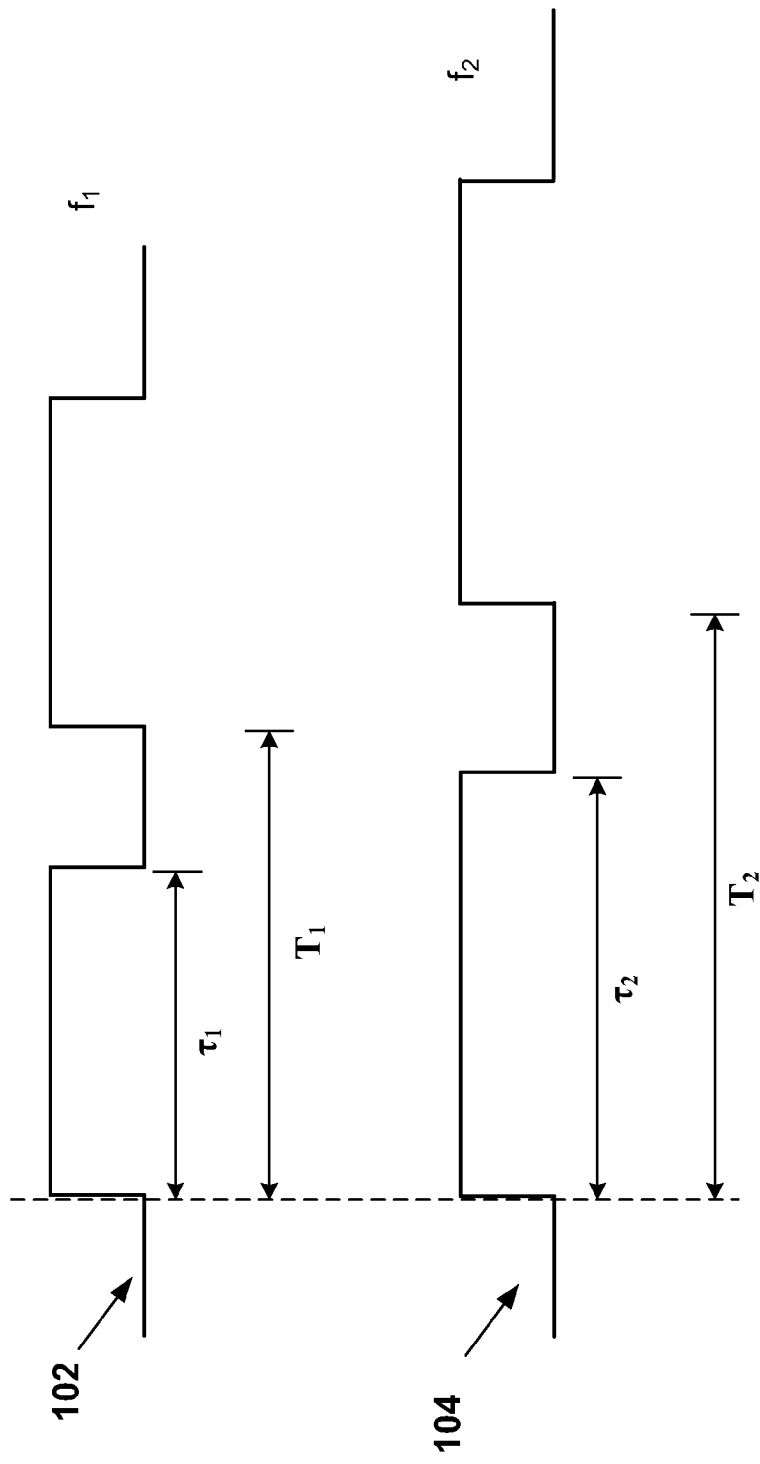
FIG. 1 illustrates one example of two different wave forms that may be generated by the control device.

Twisted pair wiring may be less expensive than many other types of cabling such as Ethernet cabling and 10 AWG (American wire gauge) building wiring. In one example embodiment, a control device may be electrically coupled to a load device over a single line. The single line may be twisted pair wiring or any other wiring comprising two conductors or a loop. The control device may transmit both power and data to the load device over the single line. Alternatively or additionally, the load device may transmit data to the control device. Thus, communication between the control device and the load device may be half-duplex or full-duplex. More than one line may connect the control and load devices.

For example, the load device may be a light-emitting diode (LED) fixture to provide lighting in a building. The control device may include a panel that controls lighting in the building. The LED fixture may be connected to the panel with twisted-pair wiring. The panel may transmit a request to the LED fixture for an identification of the type of load device while providing a low power signal to power at least a communication circuit in the LED fixture. In response, the communication circuit in the LED fixture may transmit a response indicating that the load device is the LED fixture. Thereafter, the panel may selectively transmit a higher power signal to the LED fixture in order to provide power for operation of the LED fixture. The higher power signal and or control data sent to the LED fixture may switch the LED fixture on. Additionally or alternatively, the panel may vary the power signal or provide control data to the LED fixture to control the brightness of the LED fixture.

The control device may include a circuit that generates a signal to deliver power to the load device and controls the amount of power delivered through pulse-width modulation (PWM) of the signal and/or through amplitude modulation of the signal. PWM of the signal may include the modulation of the duty cycle of the signal in order to vary the amount of power delivered. The duty cycle is the fraction of time that the signal is in an "active" state, which, for a periodic function, may be represented as:

$$\text{duty cycle } D = \tau/T$$

where τ is the duration that the function is non-zero and T is the period of the function. Examples of the control device include a switched-mode power supply, an AC to DC (Alternating Current to Direct Current) converter, a DC to DC (Direct Current to Direct Current) converter, a fixed-frequency PWM converter, a variable-frequency quasi-resonant ZCS/ZVS (Zero-Current Switching/Zero-Voltage Switching) converter, a voltage converter, a current converter, a hysteretic controller, and a PWM buck converter. Other power sources may be used. Alternatively or additionally, the amplitude of the pulse-width modulated signal may be varied to change the average amount of power delivered to the load device while the duty cycle remains fixed.

The circuit may generate any type of pulse-width modulated signal, such as a pulse wave, a square wave, a rectangular wave, or a sinusoidal wave. The signal may be considered in an "active" state when the voltage or the current of the signal exceeds a determined threshold. Pulse width modulation may be provided where the duty cycle is different than ½ or 0.5.

The control device may transmit data to the load device using frequency modulation of the pulse-width modulated signal while maintaining a constant duty cycle. For example, the control device may generate alternate wave forms, where each one of the wave forms has the same duty cycle, but each one of the wave forms has different frequencies.

The load device may be one or more devices suitable to receive power transmitted by the control device. Examples of the load device include a LED, a switch, a network device, a LCD (Liquid Crystal Display) touch screen, a dimmer control, a motion detector, a photosensor, a brightness sensor, and any other device or combination of devices suitable to receive power from the control device.

FIG. 1 illustrates one example of two different wave forms 102 and 104 that may be generated by the control device. The two wave forms 102 and 104 both have the same duty cycle. Therefore, the control device may transmit either one of the two different wave forms 102 and 104 and still deliver the same amount of power to the load device. Although both wave forms 102 and 104 have the same duty cycle, the frequencies of the two wave forms 102 and 104 are different from each other.

Consequently, the control device may vary the frequency of the pulse-width modulated signal in order to transmit data to the load device while keeping the duty cycle of the pulse-width modulated signal fixed. The variation in the frequency of the pulse-width modulated signal may be detected by the load device while the load device continues to receive a constant average amount of power from the control device. Each one of the two different wave forms 102 and 104 may represent one of two different states. For example, the first one of the wave forms 102 and 104 may represent a binary "0" and the second one of the wave forms 102 and 104 may represent a binary "1."

In a second example, the control device may generate n number of distinct wave forms, where each one of the wave forms has the same duty cycle but a different frequency than the others. Each one of the distinct wave forms may correspond to a corresponding one of n possible states. Thus, for example, each one of the distinct wave forms may represent a binary encoded value. In such an example, the control device is frequency-shift keying the pulse-width modulated signal. Frequency-shift keying is a frequency modulation scheme in which digital information is transmitted through discrete frequency changes of a wave form. In one example, if the control device generates four distinct wave forms, each one of the wave forms may correspond to a two-digit binary value. For example, the distinct wave forms may have frequencies of 1000 Hz, 1100 Hz, 1200 Hz, and 1300 Hz respectively. Table 1 below illustrates an example of an encoding scheme.

TABLE 1

| Frequency of Output Wave Form | Binary Encoded Value |
| --- | --- |
| 1000 Hz | 00 |
| 1100 Hz | 01 |
| 1200 Hz | 10 |
| 1300 Hz | 11 |

Figure 2:
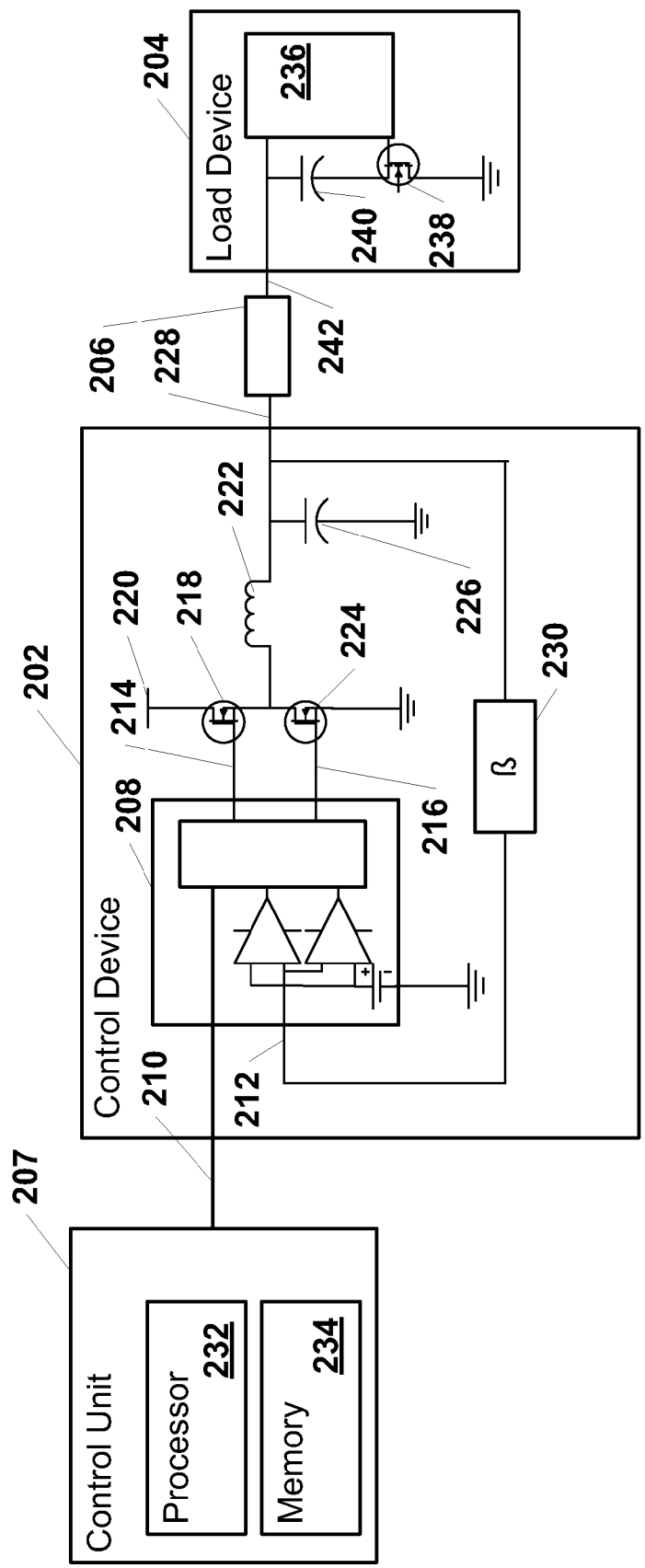
FIG. 2 illustrates one example of a system to transmit power and data from the control device to the load device over a transmission medium.

FIG. 2 illustrates one example of a system 200 to transmit power and data from the control device 202 to the load device 204 over a transmission medium 206. The system 200 may include the control device 202, the load device 204, the transmission medium 206, and a control unit 207. The system 200 may include more, fewer, or different components. For example, the system 200 may include additional load devices 204. In another example, the system 200 may include the control device 202 without the control unit 207, the transmission medium 206, and the load device 204.

The control device 202 may include a conversion controller 208, a first transistor element 218, a second transistor element 224, an inductive element 222, and a capacitive element 226. The control device 202 may include fewer, additional, or different components.

The conversion controller 208, or power converter, may include an input node 210, a feedback node 212, and two output nodes, including a positive output node 214 and a negative output node 216, respectively. The conversion controller 208 may include additional, different, or fewer nodes. For example, the conversion controller 208 may include an amplitude control node (not shown) that controls the amplitude of the signal generated at the two output nodes. In another example, the conversion controller 208 may include a node that controls the operating frequency of the conversion controller 208.

The positive output node 214 and the negative input node 216 may be inverted outputs. When the voltage at the input node 210 is high, then the voltage at the positive output node 214 may alternate between a positive value and zero at an operating frequency. Like the positive output node 214, when the voltage at the input node 210 is high, then the voltage at the negative output node 216 may alternate between the positive value and zero at the operating frequency. However, whenever the positive output node 214 is at the positive value, the negative output node 216 is at zero, and whenever the positive output node 214 is at zero, the negative output node 216 is at the positive value. When the voltage at the input node 210 is zero, then the voltage at the positive output node 214 and at the negative output node 216 may be zero. The positive output node 214 may be coupled to a gate or base of a first transistor element 218 to control the flow of current from a voltage source 220 to a first end of an inductive element 222. In one example, the negative output node 216 may be coupled to a gate or base of a second transistor element 224 to control the follow of current from the first end of the inductive element 222 to ground. The first transistor element 218 and the second transistor element 224 may be any component having the switching properties of a transistor, such as a metal-oxide-semiconductor field-effect transistor (MOSFET) or an insulated gate field effect transistor (IGFET). Alternatively, the second transistor element 224 may be a freewheeling diode and the negative output node 216 may be disconnected. The inductive element 222 may be any component having an inductance, such as an inductor. The capacitive element 226 may be any component having a capacitance, such as a capacitor.

A second end of the inductive element 222 may be coupled to a first end of a capacitive element 226. The second end of the capacitive element 226 may be grounded. The second end of the inductive element 222 may also be coupled to an output node 228 of the control device 202. The output node 228 of the control device 202 may be coupled through a gain element 230 to the feedback node 212. The feedback node 212 may be used to alter the waveforms at the positive output node 214 and the negative output node 216 to maintain a constant output voltage or a constant output current at the output node 228 of the control device 202. The gain element 230 may sense current and/or voltage at the output node 228 of the control device 202.

Alternatively, any other circuit configuration may be included in the control device 202 such that the control device 202 generates a DC power signal at the output node 228 based on the input node 210.

Figure 3:
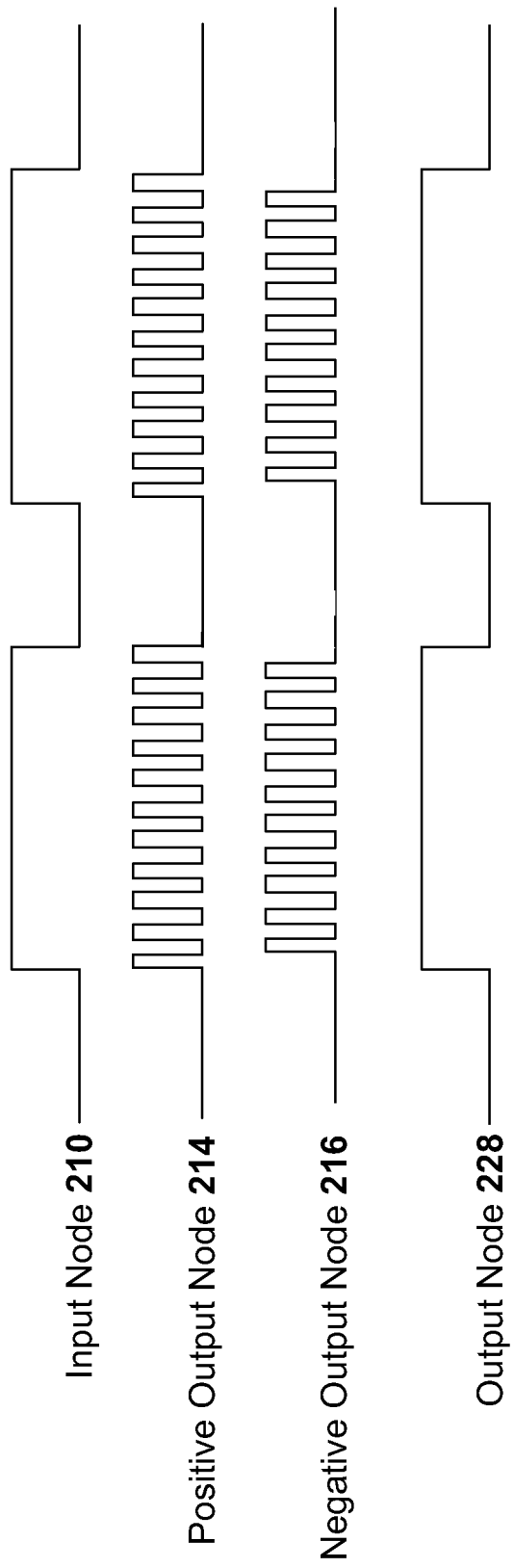
FIG. 3 illustrates example signals at multiple nodes in the control device.

FIG. 3 illustrates example signals at multiple nodes in the control device 202. The signal at the input node 210 of the conversion controller 208 drives the output node 228, because the signal at the output node 228 is to match the signal at the input node 210. When the input node 210 is active, then both the positive output node 214 and the negative output node 216 fluctuate between a predetermined positive voltage or current and zero voltage or current. In other examples, the characteristics of the signals, such as the frequencies, duty cycles, and amplitudes, may be different than illustrated.

Referring back to FIG. 2, the control unit 207 may be in communication with the control device 202 over at least the input node 210 of the control device 202. For example, the control unit 207 may additionally be in communication with the control device 202 over an output amplitude control node (not shown) of the control device 202 that is coupled to the amplitude control node (not shown) of the conversion controller 208. The control unit 207 may be any device or combination of devices that may cause generation a signal desired at the output node 228 of the control device 202. For example, the control unit 207 may cause generation of a pulse-width modulated signal having a desired duty cycle. The control unit 207 may also be configured to control the amplitude of the corresponding pulse-width modulated signal at the output node 228 of the control device 202. Examples of the control unit 207 include a server, a computer, a laptop, and an application specific integrated circuit (ASIC). In different examples, the control device 202 may include the control unit 207 or portions of the control unit 207.

The control unit 207 may include a processor 232 and a memory 234. The processor 232 may be in communication with the memory 234 and with the input node 210 of the conversion controller 202. The memory 234 may be any now known, or later discovered, data storage device. The memory 234 may be a non-volatile and/or volatile memory, such as a random access memory (RAM), a read-only memory (ROM), an erasable programmable read-only memory (EPROM), or flash memory. The memory 234 may include an optical, magnetic (hard-drive) or any other form of data storage device. The processor 232 may also be in communication with additional components, such as a display (not shown). The processor 232 may be a general processor, central processing unit, server, application specific integrated circuit (ASIC), digital signal processor, field programmable gate array (FPGA), digital circuit, analog circuit, or combinations thereof. The processor 232 may be one or more devices operable to execute computer executable instructions or computer code embodied in the memory 234 or in other memory to perform the functionality of the control unit 207.

The memory 234 may include computer code. The computer code may include instructions executable with the processor 232. The computer code may include embedded logic. The computer code may be written in any computer language now known or later discovered, such as C++, C#, Java, Pascal, Visual Basic, Perl, HyperText Markup Language (HTML), JavaScript, assembly language, and any combination thereof.

During operation, the processor 232 may control the signal generated at the output node 228 by generating a desired signal at the input node 210. For example, the processor 232 may set the duty cycle of the pulse-width modulated signal at the input node 210 such that the pulse-width modulated signal at the output node 228 delivers a determined power level to the load device 204. The processor 232 may set the duty cycle to a predetermined value and/or to a value dynamically determined. Additionally or alternatively, the processor 232 may generate the signal at the input node 210 such that the signal has a desired frequency. Using any method now known or later discovered to vary a frequency of a wave form, the processor 232 may vary the frequency of the signal at the input node 210 to transmit data to the load device 204. Additionally or alternatively, the processor may be in communication with the conversion controller 208 to alter the amplifier gain of the conversion controller 202 in order to control the amplitude of the signal at the output node 228 in order to deliver the determined power level to the load device 204.

The transmission medium 206 may be any suitable material or a vacuum that can propagate an electromagnetic signal. For example, the transmission medium 206 may be twisted pair wiring, Ethernet wiring, air, a vacuum, any other suitable material, or any combination thereof. The control device 202 may include a wireless transmitter, wireless receiver, and/or a wireless transceiver when the transmission medium 206 includes a wireless segment on a path from the controller device to the load device 204.

The load device 204 may include a processor 236 configured to detect changes in frequency of the signal transmitted over the transmission medium 206. The processor 236 may be a general processor, central processing unit, server, application specific integrated circuit (ASIC), digital signal processor, field programmable gate array (FPGA), digital circuit, analog circuit, or combinations thereof.

Alternatively or in addition, the load device 204 may include a switch 238 and a capacitive element 240. The capacitive element 240 may be any component having a capacitance, such as a capacitor. The switch 238 may be a transistor or any other component that the processor 236 may switch on and off in order to selectively couple or decouple the capacitive element 240 to the load at an input node 242 of the load device 204. In one example, one end of the capacitive element 240 may be coupled to the input node 242. The other end of the capacitive element 240 may be coupled to one end of the switch 238. The other end of the switch 238 may be grounded. In an alternative example, the capacitive element 240 and the switch 238 may be swapped in the circuit. In still another example, the load device 204 may include any other circuit configured to selectively add or remove impedance to the load at the input node 242.

Figure 8:
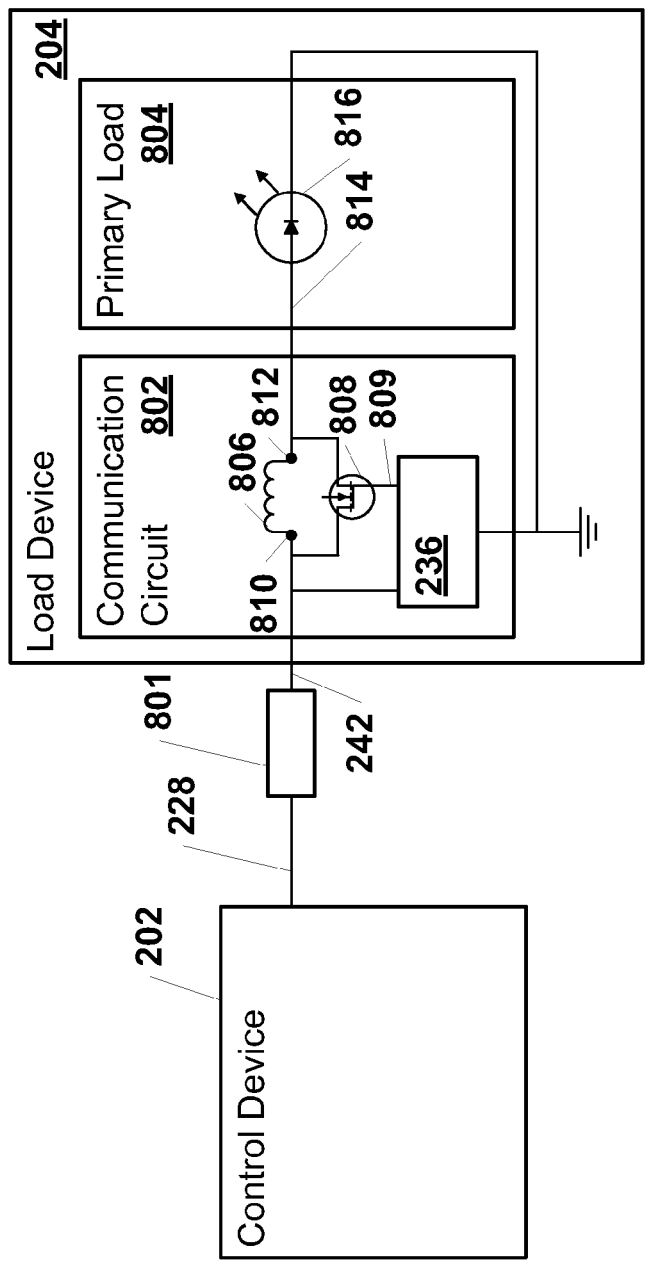
FIG. 8 illustrates one example of a system to receive power from a control device and to transmit data to the control device.

When the transmission medium 206 includes an electrically conductive line that electrically couples the control device 202 to the load device 204, the load device 204 may transmit data to the control device 202 by altering the impedance on the electrically conductive line. For example, when the capacitive element 240 is coupled to the input node 242 of the load device 204, then the impedance on the line includes the capacitive element 240. In contrast, when the capacitive element 240 is decoupled from the input node 242 of the load device 204, then impedance on the line does not include the capacitive element 240. Additionally or alternatively, an inductive element (not shown) may be connected between the input node 242 of the load device 204 and other circuitry included in the load device 204. The inductive element may be any component having inductance, such as an inductor. The inductive element may be switched in and out to alter the impedance on the line. FIG. 8 illustrates an example of the load device 202 including the inductive element.

The control device 202 may detect the change in impedance on the line by detecting a change in the operating frequency. The operating frequency is the frequency of the waveform at the positive output node 214 and at the negative output node 216 when the input node 210 is high. The operating frequency depends at least in part on the impedance on the line electrically coupled to the output node 228 of the control device 202. The impedance on the line may include the impedance of the line. The impedance on the line may additionally include the impedance of any load coupled to the line. The impedance on the line may additionally include the inductive element 222 and the capacitive element 226 in the control device 202.

The capacitance of the capacitive element 240 of the load device 204 may be chosen based on other capacitances in the system 200. For example, the capacitance may be an order of magnitude larger than the maximum parasitic capacitance on the line without the capacitive element 226 of the control device 202 and without the capacitive element 240 of the load device 204. In one example, the maximum parasitic capacitance may include capacitance of a maximum length of wiring to be used, connector capacitance, and any other capacitance that exists on the line other than the capacitive element 226 of the control device 202. In other examples, a different capacitance may be selected for the capacitive element 240. The inductance of the inductive element in the load device 204 may be similarly selected by determining a maximum base inductance without the inductive element 222 of the control device 202.

Figure 4:
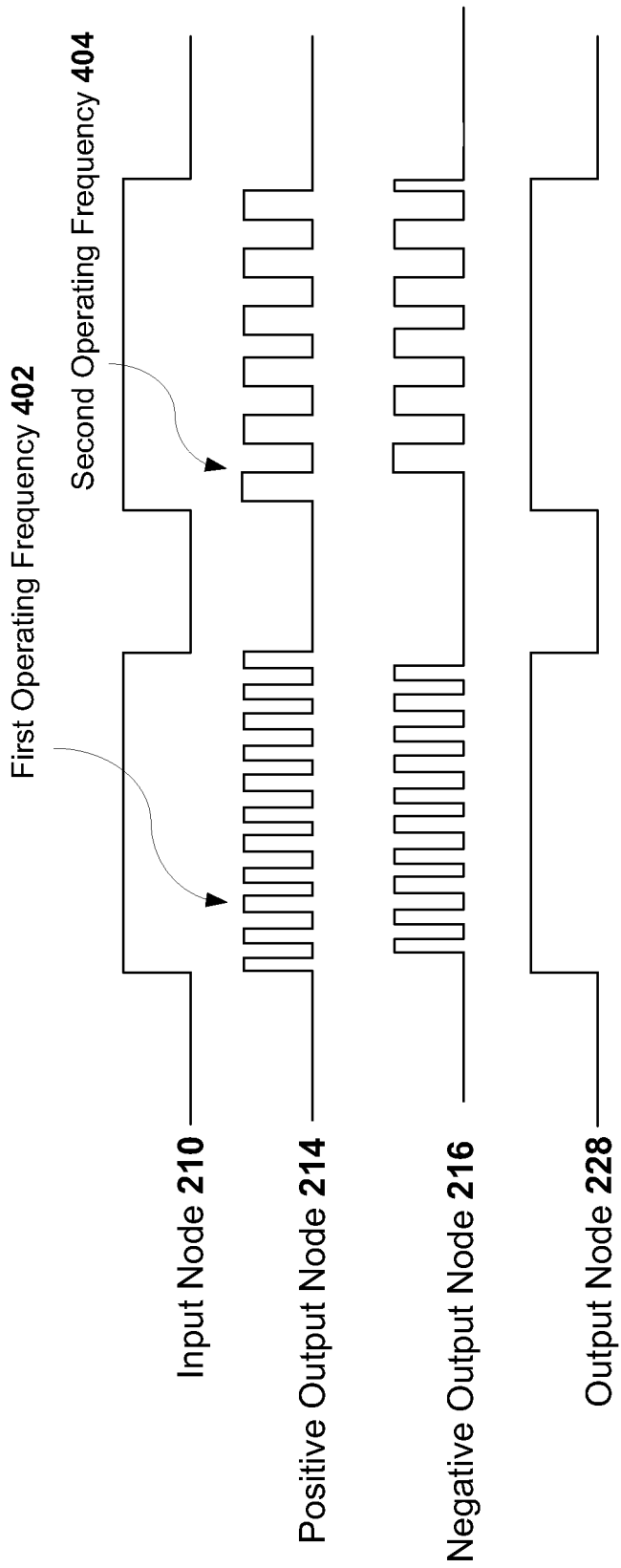
FIG. 4 illustrates example signals at multiple nodes in the control device before and after impedance on the line changes.

FIG. 4 illustrates example signals at multiple nodes in the control device 202 before and after the impedance on the line changes. In the example illustrated in FIG. 4, the waveform at the output node 228 continues to track the waveform at the input node 210 of the control device 202. Before the impedance on the line changes, the operating frequency is a first operating frequency 402. After the impedance on the line changes, then the operating frequency is a second operating frequency 404.

Figure 5:
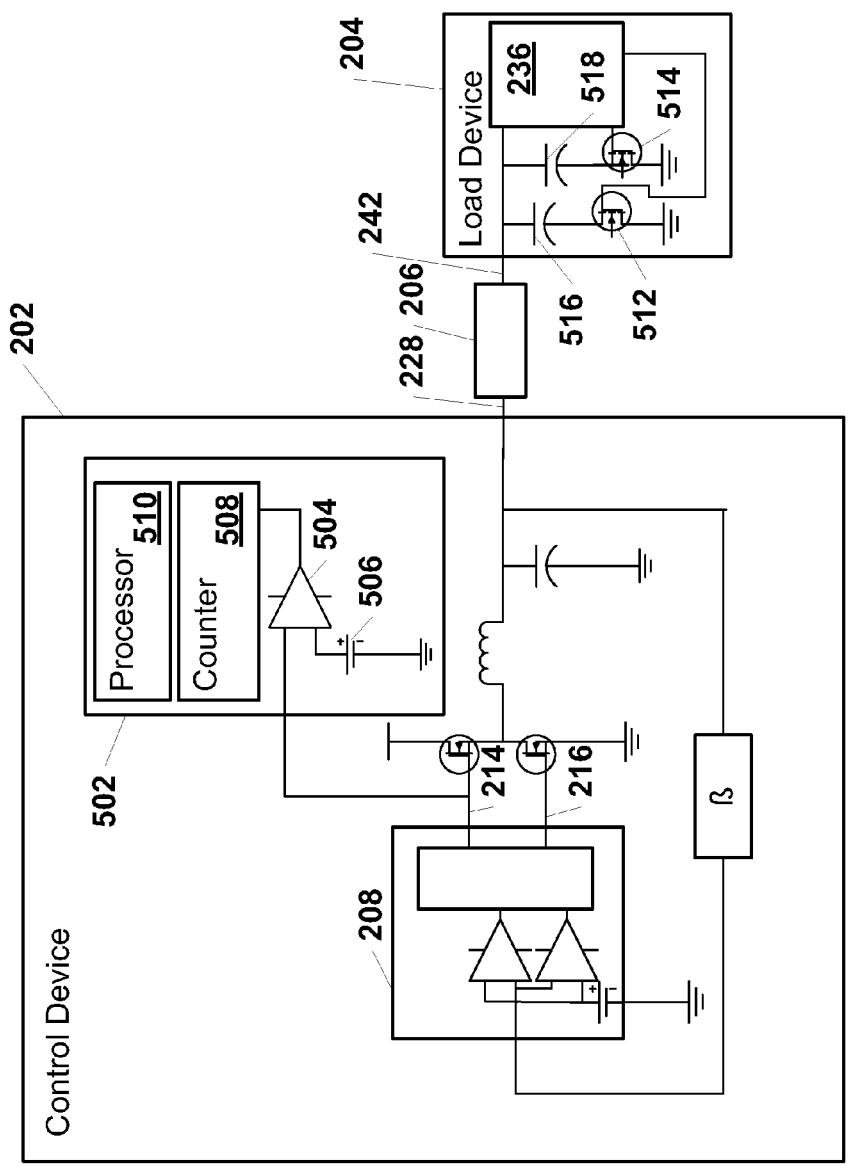
FIG. 5 illustrates an example of a frequency detection circuit in the control device to detect changes in the operating frequency.

FIG. 5 illustrates an example of a frequency detection circuit 502 in the control device 202 to detect changes in the operating frequency. The frequency detection circuit 502 may be any circuit that may determine a frequency of a signal now known or later discovered. For example, the frequency detection circuit 502 may include an operational amplifier 504, a voltage source 506, a counter/timer 508, and a processor 510. The frequency detection circuit 502 may include fewer, additional, or different components. For example, the frequency detection circuit 502 may include a field-programmable gate array and/or an ASIC.

The operational amplifier 504 may be any DC-coupled high-gain electronic voltage amplifier with differential inputs and at least one output. Alternatively, the operational amplifier 504 may be a buffer, a level-shifter, or a comparator. The counter/timer 508 may be any component that may count the transitions between highs and lows in a signal. The processor 510 may be a general processor, central processing unit, server, application specific integrated circuit (ASIC), digital signal processor, field programmable gate array (FPGA), digital circuit, analog circuit, or combinations thereof. In a different example, the processor 510 may include the counter/timer 508.

A first input of the operational amplifier 504 may be coupled to the voltage source 506. A second input of the operational amplifier 504 may be coupled to any node in the control device 202 at which the current and/or voltage fluctuates at the operating frequency. For example, the second input of the operational amplifier 504 may be coupled to the positive output node 214 or the negative output node 216. An output node of the operational amplifier 504 may be electrically coupled to the counter/timer 508. The counter/timer 508 may be electrically coupled to the processor 510.

During operation, the operational amplifier 504 may generate a signal at the output node of the operational amplifier 504 that corresponds to the signal at the second input of the operational amplifier 504 without drawing excessive current from the node coupled to the second input. The counter/timer 508 may count the transitions between highs and lows in the signal at the output node of the operational amplifier 504. By counting the transitions over a period of time, the counter/timer 408, and/or the counter/timer 408 in conjunction with the processor 510, may determine the operating frequency.

Thus, by altering the impedance on the line that is electrically coupled to the output node 228 of the control device 202, the load device 204 may modulate the operating frequency in the control device 202. The frequency detection circuit 502 may detect each different operating frequency. Each detected frequency may correspond to a different state. For example, where the operating frequency is modulated between two different frequencies, the frequencies may represent a binary "1" and "0" respectively.

In one example, the load device 204 may modulate the operating frequency between n different frequencies to represented n different states. For example, where n is four, then each one of the frequencies may correspond to a two-bit binary value, which may indicate any one of four states.

In FIG. 5, the load device 204 is configured to modulate the operating frequency between four different frequencies. The load device 204 may include the processor 236, a first transistor element 512, a second transistor element 514, a first capacitive element 516 and a second capacitive element 518. The first transistor element 512 and the first capacitive element 516 may be connected in series between the input node 242 of the load device 204 and ground, such that the gate or base of the first transistor element 512 operates as a switch to add and/or remove the first capacitive element 516 to and from the load capacitance at input node 242 of the load device 204. Similarly, the second transistor element 514 and the second capacitive element 518 may be connected in series between the input node 242 of the load device 204 and ground, such that the gate or base of the second transistor element 514 operates as a switch to add and/or remove the second capacitive element 518 to and from the load capacitance at the input node 242. The processor 236 may be electrically coupled to the gate or base of each respective one of the transistor elements 512 and 514. With both transistor elements 512 and 514 switched off, the impedance at the output node 228 of the control device 202 may be a base impedance, Z. If the first capacitive element 516 has a capacitance of C1 and the second capacitive element 518 has a capacitance of C2, then the load device 204 may vary the impedance of the load at the input node 242 of the load device 204 to any one of the following four values: Z, Z+C1, Z+C2, and Z+C1+C2 by selectively adding and/or removing the capacitive elements 516 and 518. The operating frequency may be modulated to four different frequencies corresponding to the four different impedances. The load device 204 may include any other circuit that is configured to selectively modify the impedance to send data to the control device 202.

The base impedance at the output node 228 of the control device 202 may vary based on the transmission medium 206. For example, the transmission medium 206 may be standard AC (alternating current) wiring such as 10 AWG, 12 AWG, 14 AWG, 16 AWG, or low voltage cabling such as Category (Cat) 3, Cat 5, Cat 5e, and Cat 6. Because the base impedance may vary depending on the particulars of a configuration such as the wiring and the type of load device 204, the control device 202 may communicate with the load device during an initialization phase to determine the potential operating frequencies. For example, the control device 202 may transmit a request to the load device 204 asking the load device 204 to cycle through the possible impedance modifications. The control device 202 may determine the frequencies of the operating frequency that correspond to the different impedances as the load device 204 cycles through the different impedances.

The operating frequency may depend on input voltage and load voltage. In the case of the load voltage, the operating frequency may change with the temperature. For example, when the load device 204 includes an LED, the load voltage may change with the temperature of the LED. The temperature of the LED may be affected by both the ambient environment and the power that the LED is dissipating. The operating frequency fluctuations from such temperature changes may occur fairly slowly, such as on the order of seconds and minutes, due to thermal inertia. The control device 202 may compensate for such fluctuations by periodically requesting that the load device 204 cycle through the possible impedance modifications. For example, on request, the load device 204 may open the switch 238 for the capacitive element 240, and the control device 202 may measure the operating frequency. The load device 204 may subsequently close the switch 238 for the capacitive element 240 and the control device 202 may measure the altered operating frequency. Thus, the system 200 may compensate for external effects and enable use of different input voltages and different diode voltages.

Figure 6:
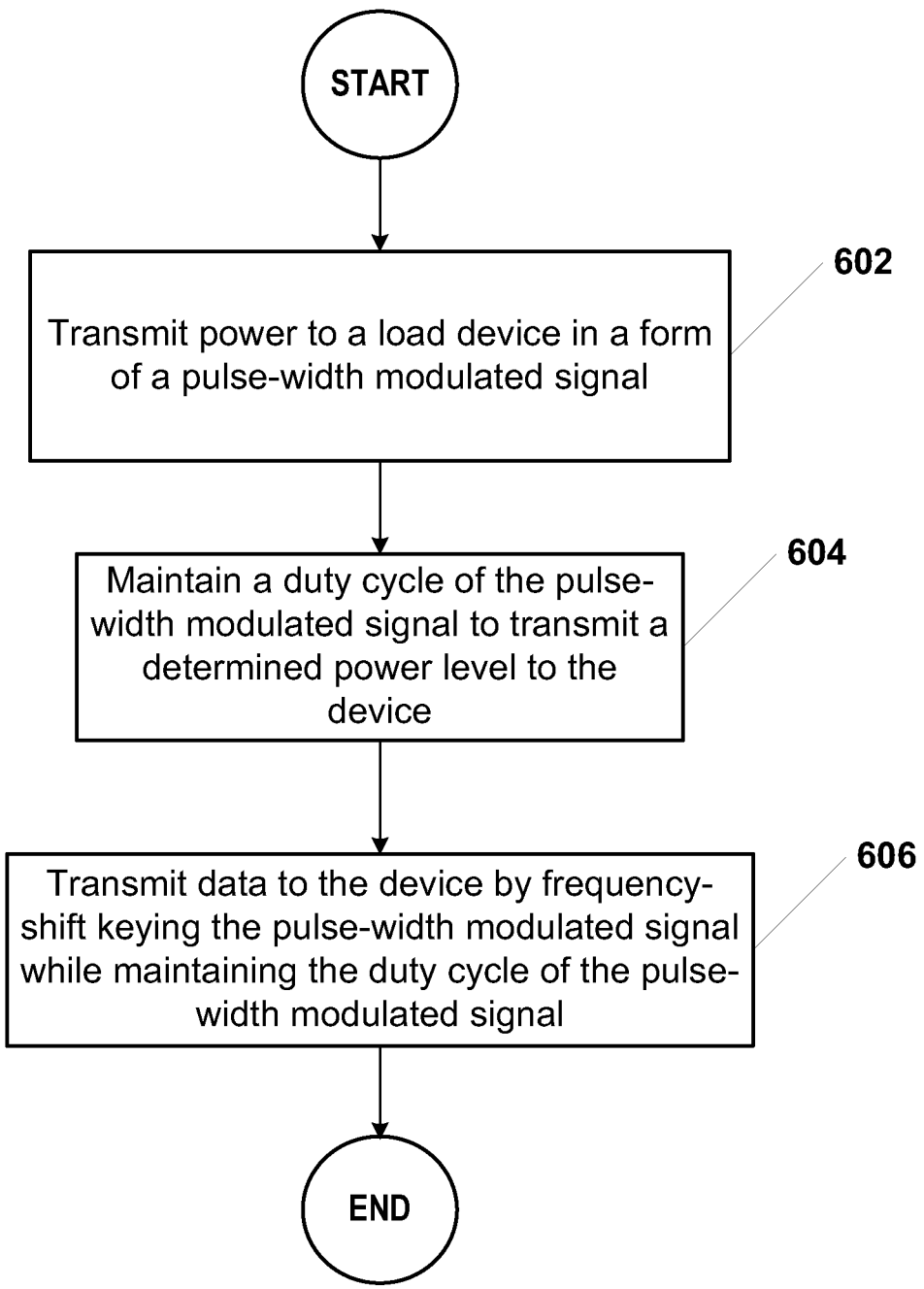
FIG. 6 illustrates one embodiment of a method to transmit power and data to the load device.

FIG. 6 illustrates one embodiment of a method to transmit power and data to the load device 204. Additional, different, or fewer acts may be performed. The acts may be performed in a different order than illustrated in FIG. 6.

In act 602 of the embodiment illustrated in FIG. 6, the operation may begin by transmitting power to the load device 204 in the form of a pulse-width modulated signal.

In act 604, the operation may continue by maintaining a duty cycle of the pulse-width modulated signal to transmit a determined power level to the load device 204. In one example, the determined power level may be a predetermined power level. In a second example, the determined power level may be dynamically determined by the control device 202. At different times, a different power level is provided. The variation in power level is at a sufficiently low frequency that the frequency variation for data communication is not altered.

In act 606, the operation may include transmitting data to the load device 204 by frequency-shift keying the pulse-width modulated signal while maintaining the duty cycle of the pulse-width modulated signal, where a variation in the frequency of the pulse-width modulated signal is detectable by the load device 204 and represents at least a portion of the data.

Figure 7:
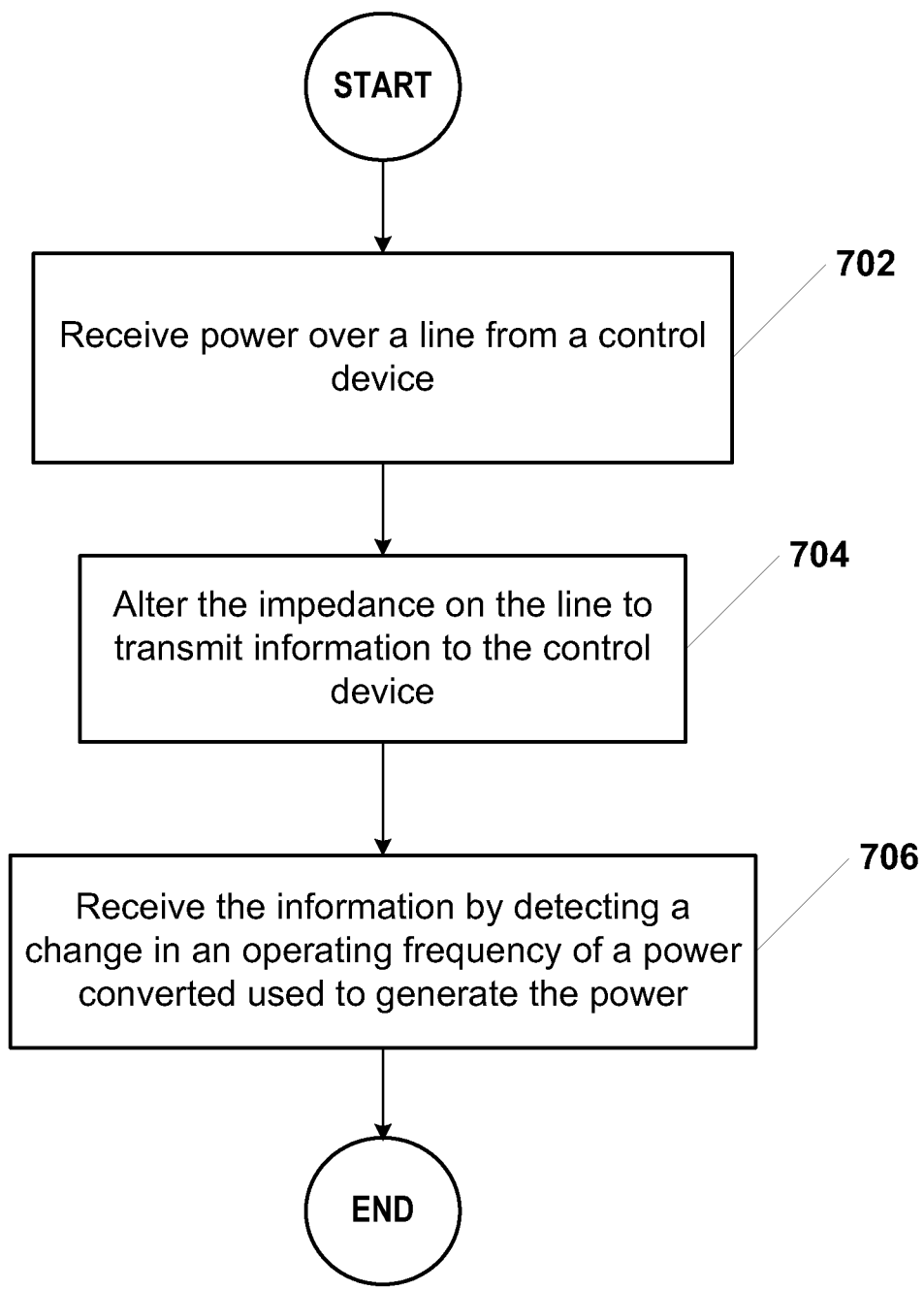
FIG. 7 illustrates one embodiment of a method to receive power from the control device over a line and to transmit information to the control device.

FIG. 7 illustrates one embodiment of a method to receive power from the control device 202 over a line and to transmit information to the control device 202. Additional, different, or fewer acts may be performed. The acts may be performed in a different order than illustrated in FIG. 7.

In act 702 of the embodiment illustrated in FIG. 7, the operation may begin by receiving power from the control device 202 over a line. In one example, the power received may be in the form of a pulse-width modulated signal. In another example, the power received may be in the form of a DC signal having no variation in voltage over time. In yet another example, the power received may be in the form of a DC signal having no variation in current over time.

In act 704, the operation may continue by altering the impedance on the line to transmit information to the control device 202. For example, altering the impedance on the line may include switching in a capacitive element 240 and/or an inductive element in the load device 204 in order to change the impedance of the load.

In act 706, the operation may complete by receiving the information by detecting a change in an operating frequency of an amplifier used to generate the power. The change in the operating frequency may result from altering the impedance on the line.

FIG. 8 illustrates one example of the system 200 to receive power from the control device 202 and to transmit data to the control device 204. The load device 204 may be electrically coupled to the control device 202 over a line 801. The load device 204 may include the input node 242, which may be coupled to the line 801. The load device 204 may also include a communication circuit 802 and a primary load 804.

The communication circuit 802 may be any circuit configured to alter the impedance of the load device 204 in order to communicate with the control device 202. For example, the communication circuit 802 may include the processor 236, an inductive element 806, and a transistor element 808. The inductive element 806 may be any component having an inductance, such as an inductor. The transistor element 808 may be any component having the switching properties of a transistor, such as a metal-oxide-semiconductor field-effect transistor (MOSFET) or an insulated gate field effect transistor (IGFET). The transistor element 808 and the inductive element 806 may be connected in parallel so that a signal at a gate 809 of the transistor element 806 may selectively short the inductive element 806. A first node 810 of the inductive element 806 may be coupled to the input node 242. A second node 812 of the inductive element 806 may be coupled to a power input node 814 of the primary load 804.

The processor 236 may be coupled to the gate 809 of the transistor element 808 to control whether the impedance of the inductor element 806 is added to the load at the input node 242. The processor 236 may be powered by the signal received at the input node 242.

The primary load 804 may be any device or combination of devices that may be powered by DC. Examples of the primary load 804 include an LED 816, a dimmer switch, a motion sensor, or any combination thereof. The primary load 804 may receive the power from the communication circuit 802 at the power input node 814 of the primary load 804.

As in the example illustrated in FIG. 8, the load device 204 may be an integrated device that includes the communication circuit 802 and the primary load 804. In a different example, the communication circuit 802 may be a device separate from the primary load 804.

During operation, the control device 202 may transmit power to the load device 204 by sending a DC signal over the line 801. In one example, the DC signal may be pulse-width modulated. Alternatively or additionally, the DC signal may not be pulse-width modulated. For example, the DC signal may be a constant voltage and/or current. In one example, the load device 204 may be a power converter configured to receive power from the control device 202. The power converter may request a determined level of power from the control device 202.

By alternating between adding the impedance of the inductive element 806 and shorting out the inductive element 806, the processor 236 may transmit data to the control device 202 as described earlier.

One advantage of the example system 200 may be that the load device 204 may include inexpensive and simple components to communicate with the control device 202. Another advantage may be that the efficiency of the power delivery is unaffected or negligibly affected when the load device 204 transmits data to the control device 202. Other types of systems may incur additional power loss in order to communicate data to the load device 204. Still another advantage may be that the control device 202 may transmit data to the load device 104 without affecting or at least negligibly affecting the efficiency of the power delivery.

Yet another advantage may be that the control device 202 may generate a relatively low power signal to power the communication circuit 802 included in the load device 204 without fully powering the load device 204. The control device 202 may generate a relatively high power signal to the load device 204 when the load device 204 is to be fully powered. In this manner, data may be exchanged between the control device 202 and the load device 204 without the control device 202 having to deliver excess power to the load device 204. In one example, the communication circuit 802 may request full power by sending a request to the control device 202. Alternatively or additionally, the control device 202 may increase the power without any request from the communication circuit 802. In one example, the communication circuit 802 may transmit the request to the control device 202 by altering the impedance in a predetermined pattern that indicates to the control device 202 that full power is requested.

For example, the control device 202 may generate a signal with enough power to power the processor 236 in the load device 204, but not enough power to illuminate the LED 816 included in the primary load 804. The LED 816 may require a minimum amount of power in order to illuminate. When desired, the control device 202 may generate the relatively high power signal in order to illuminate the LED 816. Similarly, the control device 202 may switch from the relatively high power signal to the relatively low power signal to turn the LED 816 off while still powering the communication circuit 802.

Different components provide different functions for implementing the functionality of the various embodiments. The respective logic, software or instructions for implementing the processes, methods and/or techniques discussed above are provided on computer-readable storage media or memories or other tangible media, such as a cache, buffer, RAM, removable media, hard drive, other computer readable storage media, or any other tangible media or any combination thereof. The tangible media include various types of volatile and nonvolatile storage media. The functions, acts or tasks illustrated in the figures or described herein may be executed in response to one or more sets of logic or instructions stored in or on computer readable storage media. The functions, acts or tasks are independent of the particular type of instructions set, storage media, processor or processing strategy and may be performed by software, hardware, integrated circuits, firmware, micro code and the like, operating alone or in combination. Likewise, processing strategies may include multiprocessing, multitasking, parallel processing and the like. In one embodiment, the instructions are stored on a removable media device for reading by local or remote systems. In other embodiments, the logic or instructions are stored in a remote location for transfer through a computer network or over telephone lines. In yet other embodiments, the logic or instructions are stored within a given computer, central processing unit ("CPU"), graphics processing unit ("GPU"), or system. Any of the devices, features, methods, and/or techniques described may be mixed and matched to create different systems and methodologies.

While the invention has been described above by reference to various embodiments, it should be understood that many changes and modifications can be made without departing from the scope of the invention. It is therefore intended that the foregoing detailed description be regarded as illustrative rather than limiting, and that it be understood that it is the following claims, including all equivalents, that are intended to define the spirit and scope of this invention.

What is claimed is:

1. A method comprising:
   transmitting a power signal to a Light Emitting Diode (LED) and a communication circuit associated with the LED, the power signal having enough power to power the communication circuit but not enough to illuminate the LED;
   transmitting data to the communication circuit by varying the power signal while keeping the power of the power signal below a power level at which the LED illuminates; and
   increasing the power of the power signal to at least the power level at which the LED illuminates.

2. The method of claim 1 further comprising transmitting data to the communication circuit by varying the power signal while keeping the power of the power signal at or above the power level at which the LED illuminates.

3. The method of claim 1 further comprising selectively adding or removing impedance to a line with the communication circuit, wherein the line propagates the power signal to the communication circuit and the LED.

4. The method of claim 3 wherein the selectively adding or removing impedance to the line is in response to receipt of data encoded in the power signal.

5. An apparatus comprising:
   a communication circuit configured to receive a power signal from a control device over a line,
   the communication circuit further configured to receive a first plurality of data values encoded in variations of the power signal while the power in the power signal remains at a first constant power level, and
   wherein the communication circuit is further configured to receive a second plurality of data values encoded in variations of the power signal while the power in the power signal remains at a second constant power level.

6. The apparatus of claim 5, wherein at least a portion of the power in the power signal is received by a Light Emitting Diode (LED), and the first constant power level is less than a power level that causes the LED to illuminate.

7. The apparatus of claim 6, wherein the second constant power level is greater than or equal to a power level that causes the LED to illuminate.

8. The apparatus of claim 6, wherein the LED is included in a building light fixture.

9. The apparatus of claim 5, wherein the communication circuit comprises a switch, the communication circuit is configured to selectively add or remove a circuit element to or from the line, respectively, with the switch.

10. The apparatus of claim 9, wherein the switch includes a transistor.

11. An apparatus comprising:
    a control device configured to transmit a power signal to a communication circuit associated with a load device; and
    a control unit configured to cause the control device to encode a first plurality of data values in the power signal while the power in the power signal remains at a first constant power level, and
    the control unit further configured cause the control device to encode a second plurality of data values in the power signal while the power in the power signal remains at a second constant power level.

12. The apparatus of claim 11, wherein the load device includes a Light Emitting Diode (LED).

13. The apparatus of claim 11, wherein the load device includes a light fixture.

* * * * *